(12) United States Patent
Smidebrant (10) Patent No.: US 11,863,000 B2
(45) Date of Patent: Jan. 2, 2024

(54) ENERGY STORAGE SYSTEM FOR A VEHICLE (71) Applicant: VOLVO TRUCK CORPORATION, Gothenburg (SE)

(72) Inventor: Tobias Smidebrant, Gothenburg (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 0 days.

(21) Appl. No.: 17/651,647

(22) Filed: Feb. 18, 2022

(65) Prior Publication Data

US 2022/0271551 A1 Aug. 25, 2022

(30) Foreign Application Priority Data

Feb. 24, 2021 (EP) .................................. 21020098

(51) Int. Cl.
H02J 7/00 (2006.01)
B60L 3/00 (2019.01)
(Continued)

(52) U.S. Cl.
CPC ........ H02J 7/00304 (2020.01); B60L 3/0046 (2013.01); B60L 3/04 (2013.01);
(Continued)

(58) Field of Classification Search
CPC .... H02J 7/00304; H02J 7/0013; H02J 7/0031; H02J 7/0047; H02J 7/0063;
(Continued)

(56) References Cited

U.S. PATENT DOCUMENTS

2010/0127663 A1* 5/2010 Furukawa ............... B60L 58/15
320/134
2012/0086404 A1* 4/2012 Lim .................... H02J 7/00304
320/128
(Continued)

FOREIGN PATENT DOCUMENTS

DE 102013012578 A1 2/2015
DE 102016101252 A1 7/2017
(Continued)

OTHER PUBLICATIONS

European Search Report dated Sep. 3, 2021 in corresponding European Patent Application No. 21020098.6, 9 pages.
(Continued)

Primary Examiner — Lincoln D Donovan
Assistant Examiner — Alex W Lam
(74) Attorney, Agent, or Firm — Venable LLP; Jeffri A. Kaminski (57) ABSTRACT An energy storage system for a vehicle, includes one or more battery units for storing electrical energy; at least one high voltage switch for connection and disconnection of the one or more battery units to at least one load, such as an electrical machine; a fuse for disconnection of the one or more battery units when the energy storage system experiences an overcurrent being above a predetermined overcurrent value. The energy storage system is configured to during use, identify if a condition has occurred which requires immediate shutdown of the energy storage system.

14 Claims, 3 Drawing Sheets (51) Int. Cl.
*B60L 3/04* (2006.01)
*G01R 31/382* (2019.01)

(52) U.S. Cl.
CPC .......... *G01R 31/382* (2019.01); *H02J 7/0013* (2013.01); *H02J 7/0031* (2013.01); *H02J 7/0047* (2013.01); *H02J 7/0063* (2013.01); *H02J 7/00714* (2020.01)

(58) Field of Classification Search
CPC . H02J 7/00714; H02J 2310/48; B60L 3/0046; B60L 3/04; B60L 3/0007; B60L 3/12; B60L 2240/549; B60L 58/18; B60L 3/0069; B60L 3/0092; B60L 50/60; G01R 31/382; H01H 2039/008; H01H 2085/466; H01H 85/46; H01H 89/00; H01H 9/10; H01H 39/00; H01M 10/44; H01M 10/48; H01M 50/583; H01M 2010/4271; H01M 2220/20; H01M 10/425; H02H 3/021; H02H 3/087; G06F 9/06; B60Y 2200/91; B60Y 2200/92; Y02T 10/70
See application file for complete search history.

(56) References Cited

U.S. PATENT DOCUMENTS

| | | | |
|---|---|---|---|
| 2014/0153150 A1* | 6/2014 | LePort | B60L 3/0046 |
| | | | 361/93.1 |
| 2015/0200559 A1* | 7/2015 | Im | H02J 7/0029 |
| | | | 307/18 |
| 2020/0075277 A1* | 3/2020 | McTigue | H01H 71/02 |

FOREIGN PATENT DOCUMENTS

| | | |
|---|---|---|
| DE | 102018207247 A1 | 6/2019 |
| DE | 102020005248 A1 | 11/2020 |

OTHER PUBLICATIONS

European Communication Pursuant to Article 94(3) dated Oct. 6, 2023 in corresponding European Patent Application No. 21020098.6, 6 pages.

* cited by examiner

ENERGY STORAGE SYSTEM FOR A VEHICLE

TECHNICAL FIELD

The invention relates to an energy storage system for a vehicle. The invention also relates to a method for controlling an energy storage system of a vehicle, a control unit, a vehicle, a computer program and a computer readable medium.

The invention can be applied in heavy-duty vehicles, such as trucks, buses and construction equipment. Although the invention will be described with respect to a truck, the invention is not restricted to this particular vehicle, but may also be used in other vehicles such as trucks, buses, wheel loaders, excavators, passenger cars and marine vessels.

BACKGROUND

Electrification of vehicles, i.e. using electric motors for propulsion of the vehicles, is an ongoing trend which has been increasing in recent years. Electric vehicles may be fully electric vehicles, i.e. only driven by use of electric motors, or partly electric vehicles, i.e. hybrid vehicles also using another power source, such as an internal combustion engine.

An electric vehicle typically comprises a high voltage energy storage system and one or more electric motors for propulsion, wherein the energy storage system includes one or more battery units for storing electrical energy. For example, a high voltage energy storage system may be defined as an energy storage system which has a voltage level of more than 100 volts (v), such as more than 200 v, for example in the range of 100-1000 v or 200-1000 v.

For such a system safety is crucial since a user may be seriously injured if being exposed to such a high voltage level and/or high current level. Therefore, it is of utmost importance to design the system with safety measures such that the system can be shut down in case of e.g. a vehicle accident or any other fault, thereby mitigating the risk of personal injuries.

For this purpose, a fuse or a switch may be used for shutting down the system. For example, it is known to use a fuse which automatically shuts down the energy storage system when an overcurrent value is reached, and which also may be actively triggered when an accident has occurred. Once the fuse has been triggered it needs to be replaced or at least repaired in order to function again.

Even though the above-mentioned system provides increased safety, there is still a strive to develop further improved energy systems for vehicles which provides increased safety, which are more cost-effective and/or which provides increased flexibility.

SUMMARY

Therefore, an object of the invention is to provide an improved energy storage system for a vehicle, or at least to provide a suitable alternative. More specifically, an object of the invention is to provide an improved energy storage system for a vehicle which provides increased safety, is cost-effective and/or provides increased flexibility. Another object of the invention is to provide an improved method for controlling an energy storage system of a vehicle, a control unit, a vehicle, a computer program and/or a computer readable medium.

According to a first aspect of the invention, the object is achieved by an energy storage system for a vehicle according to claim 1. Thus, an energy storage system for a vehicle is provided, comprising:

one or more battery units for storing electrical energy;
at least one high voltage switch for connection and disconnection of the one or more battery units to at least one load, such as an electrical machine;
a fuse for disconnection of the one or more battery units when the energy storage system experiences an overcurrent being above a predetermined overcurrent value;
wherein the energy storage system is configured to:
during use, identify if a condition has occurred which requires immediate shutdown of the energy storage system; and if it is identified that immediate shutdown is required, the energy storage system is further configured to:
measure a value indicative of current in the energy storage system;
if the measured value indicative of current is equal to or below a level at which it is safe to open the at least one high voltage switch, the energy storage system is configured to immediately shut down the energy storage system by opening the at least one high voltage switch, and
if the measured value indicative of current is above the level at which it is safe to open the at least one high voltage switch but lower than the predetermined overcurrent value, the energy storage system is configured to immediately shut down the energy storage system by actively triggering the fuse.

By the provision of an energy storage system as disclosed herein, an improved system is provided in which safety for a user may be increased. In addition, by the provision of the energy storage system as disclosed herein, a more cost-effective system may be achieved, and/or a more flexible system may be achieved. In particular, the present invention is based on a realization that for certain current levels for a specific energy storage system, the fuse may not be automatically triggered, and also the at least one switch cannot be disconnected without damaging the at least one switch and/or surrounding components due to a too high current level. Therefore, by actively triggering the fuse in this current range, instead of using the at least one high voltage switch, the risk of damaging the at least one high voltage switch can be avoided. In addition, the present invention is also based on a realization that when a condition has occurred which requires immediate shutdown, the fuse may not always be used. Instead, the at least one high voltage switch can be used if the current level is low enough such that the at least one high voltage switch is not damaged and/or such that no surrounding components are damaged. Disconnecting a high voltage switch at too high current levels may for instance cause sparks which may damage the high voltage switch and/or surrounding components.

A level at which it is safe to open the at least one high voltage switch preferably means a level at which the at least one high voltage switch and/or any surrounding components are not damaged, and/or a level at which not too strong sparks are generated, i.e. sparks which may melt components and/or cause fire.

A value indicative of current as used herein may refer to a value indicative of an absolute value of the current. Alternatively, or additionally, a value indicative of current as used herein may refer to a value indicative of an integral defined by current over a specific time period. Still alternatively, or additionally, a value indicative of current may refer to a value indicative of a time derivative of the current.

Actively triggering a fuse shall herein be understood as triggering a fuse by an active action, i.e. it does not refer to when it is automatically or passively triggered on its own due to an overcurrent. As such, the active action may be an action performed by the energy storage system which triggers the fuse even though its predetermined overcurrent value has not been reached.

Further advantages and advantageous features of the invention are disclosed in the following description and in the dependent claims.

Optionally, at least one of the level at which it is safe to open the at least one high voltage switch and the predetermined overcurrent value may be adjustable. Thereby a more flexible energy storage system may be provided, since the system may be used for several different vehicle types. More specifically, the same type of high voltage switch and/or fuse may thereby be used for different vehicles, where the above levels are adjusted and adapted for the specific vehicle type. As such, the energy storage system can be tailored for different vehicles without a need of replacing the at least one high voltage switch and/or fuse.

Optionally, the energy storage system may further be configured to automatically adjust the at least one of the level at which it is safe to open the at least one high voltage switch and the predetermined overcurrent value in dependence on a changed vehicle state, such as when changing from a charging state to a driving state, or vice versa. Thereby, a further improved flexibility may be achieved. It has namely been realized that the levels may preferably be set different depending on the vehicle state, e.g. if the vehicle is charging by power from the power grid or if the vehicle is driving.

Optionally, the energy storage system may further be configured to identify if the at least one high voltage switch is unable to be disconnected, and if the at least one high voltage switch is unable to be disconnected, the energy storage system is further configured to actively trigger the fuse when it also has been identified that immediate shutdown is required. For example, the at least high voltage switch may have been welded and may thereby be unable to be disconnected. If it is welded, the energy storage system may thereby actively trigger the fuse instead, even if the measured value indicative of current is below the level at which it is safe to use the at least one high voltage switch. This implies further increased safety.

Optionally, the condition which requires immediate shutdown may correspond to at least one of the following conditions: an accident of the vehicle, an emergency stop signal, a short circuit fault. An emergency stop signal may for example be a signal which is triggered by a user, or it may be any other signal triggered by any system of the vehicle, or even by a system outside the vehicle. An accident may for example be detected if an airbag of the vehicle is triggered, if an impact force on the vehicle is detected etc. An accident of the vehicle may also for example be that a fire on the vehicle is detected.

Optionally, the fuse may be a pyrotechnic fuse. A pyrotechnic fuse has shown to be beneficial in that it reliably disconnects an electrical connection when triggered. The details of a pyrotechnic fuse as such are well-known by the skilled person and will therefore not be described in further detail herein. Alternatively, the fuse could be another type of fuse, such as a magnetic fuse. A fuse as used herein means a disconnection member which is configured to disconnect an electrical connection, and wherein the disconnection cannot be reversed to a connected state again, without e.g. replacing the fuse and/or repairing the fuse. According to an example embodiment, the fuse may have no or negligible electrical resistance when used. Accordingly, a high voltage switch as used herein may be defined as an electrical connection and disconnection member which can be reused, and wherein a disconnected/connected state of the switch can be reversed to the previous state, i.e. to the other connected/disconnected state.

Optionally, the energy storage system may further comprise a dedicated hardware device, wherein the dedicated hardware device is configured to obtain the measured value indicative of current in the energy storage system and to open the at least one high voltage switch or actively trigger the fuse in dependence on the measured value indicative of current in the energy storage system. It has been further realized that it may be advantageous to provide the energy storage system with a dedicated, e.g. separate, hardware device for the disconnection operation described herein. This may imply further increased safety, in that the dedicated hardware device is exclusively dedicated to the disconnection operation and is therefore preferably not used for other purposes. Even though the disconnection operation as disclosed herein may be performed by use of e.g. a multi-purpose control unit, the dedicated hardware device only dedicated to the disconnection operation may reduce the risk for hardware and/or software faults. The dedicated hardware device is typically an electronic control unit and including hardware and/or hardware and software.

Optionally, the energy storage system may further comprise a second hardware device, preferably separate from the dedicated hardware device, which is configured to monitor if the condition has occurred which requires immediate shutdown of the energy storage system, and wherein the second hardware device is further configured to issue a signal to the dedicated hardware device when the condition has occurred. The second hardware device may also be an electronic control unit, comprising processing circuitry, such as a computer of the vehicle or the like.

According to a second aspect of the invention, the object is achieved by a method for controlling an energy storage system of a vehicle according to claim 9. Thus, a method for controlling an energy storage system of a vehicle is provided, wherein the energy storage system comprises:
  one or more battery units for storing electrical energy;
  at least one high voltage switch for connection and disconnection of the one or more battery units to at least one load, such as an electrical machine;
  a fuse for disconnection of the one or more battery units when the energy storage system experiences an overcurrent being above a predetermined overcurrent value;
  wherein the method comprises:
  during use of the energy storage system, identifying if a condition has occurred which requires immediate shutdown of the energy storage system;
  measuring a value indicative of current in the energy storage system when it is identified that immediate shutdown is required;
  immediately shutting down the energy storage system by opening the at least one high voltage switch if the measured value indicative of current is equal to or below a level at which it is safe to open the at least one high voltage switch; and
  immediately shutting down the energy storage system by actively triggering the fuse if the measured value indicative of current is above the level at which it is safe to open the at least one high voltage switch but lower than the predetermined overcurrent value.

By the provision of the method as disclosed herein, an improved method is provided in which safety for a user may be increased. In addition, by the provision of the method as disclosed herein, a more cost-effective method may be achieved, and/or a more flexible method may be achieved. Advantages and effects of the second aspect of the invention are largely analogous to the advantages and effects of the first aspect of the invention, and vice versa. It shall also be noted that all embodiments of the first aspect of the invention are applicable to and combinable with all embodiments of the second aspect of the invention, and vice versa.

Optionally, the method may further comprise automatically adjusting the at least one of the level at which it is safe to open the at least one high voltage switch and the predetermined overcurrent value in dependence on a changed vehicle state, such as when changing from a charging state to a driving state, or vice versa.

Optionally, the method may further comprise identifying if the at least one high voltage switch is unable to be disconnected, and if the at least one high voltage switch is unable to be disconnected, the method may further comprise actively triggering the fuse when it also has been identified that immediate shutdown is required.

Optionally, the method may further comprise, by e.g. use of a dedicated hardware device, obtaining the measured value indicative of current in the energy storage system, and opening the at least one high voltage switch or actively trigger the fuse in dependence on the measured value indicative of current in the energy storage system.

Optionally, the method may further comprise, by e.g. use of a second hardware device, preferably separate from the dedicated hardware device, monitoring if the condition has occurred which requires immediate shutdown of the energy storage system, and issuing a signal to the dedicated hardware device when the condition has occurred. Accordingly, the dedicated hardware device may receive a signal indicative of that the condition has occurred.

According to a third aspect of the invention, the object is achieved by at least one control unit for controlling an energy storage system of a vehicle according to claim 12. Thus, at least one control unit for controlling an energy storage system of a vehicle is provided, wherein the at least one control unit is configured to perform the method according to any one of the embodiments of the second aspect of the invention.

Advantages and effects of the third aspect of the invention are largely analogous to the advantages and effects of the first and second aspects of the invention, and vice versa. It shall also be noted that all embodiments of the first and second aspects of the invention are applicable to and combinable with all embodiments of the third aspect of the invention, and vice versa.

According to a fourth aspect of the invention, the object is achieved by a computer program according to claim 12, comprising program code to cause the at least one control unit according to the third aspect to execute the method of any one of the embodiments of the second aspect of the invention. According to a fifth aspect of the invention, the object is achieved by a computer readable medium according to claim 14, having stored thereon the computer program of the fourth aspect of the invention.

According to a sixth aspect of the invention, the object is achieved by a vehicle according to claim 15 comprising the energy storage system according to any one of the embodiments according to the first aspect of the invention.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
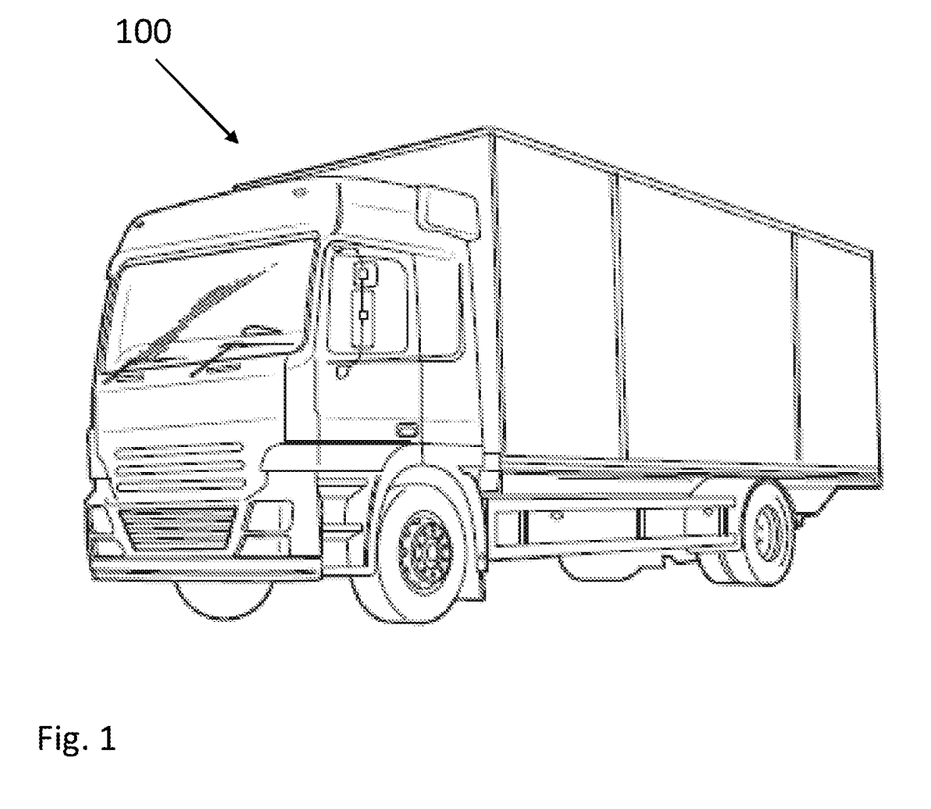
FIG. 1 is a perspective view of a vehicle according to an embodiment of the present invention.

FIG. 1 shows a perspective view of a vehicle 100 according to an example embodiment of the sixth aspect of the invention. The vehicle as shown is a heavy-duty truck comprising an energy storage system 1 (not shown) according to an example embodiment of the invention, such as the energy storage system shown in FIG. 2. Accordingly, the truck 100 may be a fully electric vehicle, comprising one or more electric motors (not shown) for propelling the truck 100. As mentioned in the above, the vehicle 100 may also for instance be a hybrid vehicle, comprising also e.g. an internal combustion engine (not shown). As also mentioned in the above, the present invention is applicable to many different kinds of vehicles, including but not limited to other types of trucks, buses, construction equipment, such as wheel loaders, excavators etc., passenger cars and also marine vessels.

Figure 2:
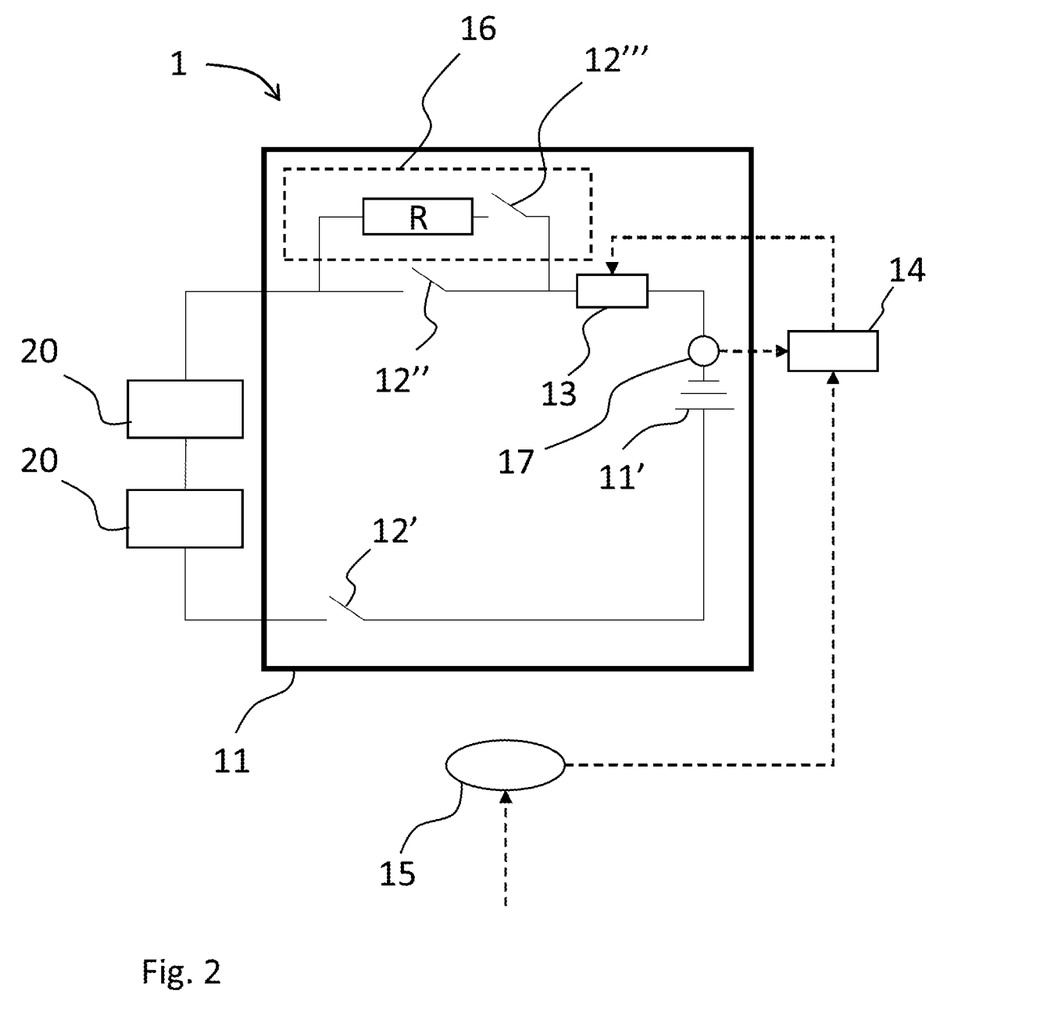
FIG. 2 is schematic view of an energy storage system according to an embodiment of the present invention.

FIG. 2 shows a schematic view of an energy storage system 1 according to an example embodiment of the present invention. The energy storage system 1 comprises one or more battery units 11 for storing electrical energy. The one or more battery units 11 may be any kind/s of battery unit/s, and may for example comprise one or more battery cells 11' connected electrically in series. The battery cells 11' may for example be lithium ion battery cells, but may of course be of any other kind known to the skilled person, as long as they are capable of storing electrical energy.

The energy storage system 1 further comprises at least one high voltage switch 12', 12", 12"' for connection and disconnection of the one or more battery units 11 to at least one load 20, such as an electrical machine. In the shown embodiment there are three high voltage switches, i.e. 12', 12" and 12"'. The switches 12', 12", 12"' may be of any kind known to the skilled person, such as an electromechanical switch. In addition, in the shown embodiment there are two loads 20 connected electrically to the battery unit 11. The loads 20 may as mentioned be electric motors for propulsion of the vehicle 100 as shown in e.g. FIG. 1. The one or more loads 20 may of course be any other kind of load which consumes electrical power, such as a fan, an air conditioning system etc. In case the load 20 is not configured to be connected directly to a high voltage system, it may be connected thereto via a transformer (not shown) which reduces the voltage level to a suitable level.

In the shown embodiment, the high voltage switch 12" is part of a pre-charge circuit 16 of the battery unit 11, being represented by a box with dashed lines. The pre-charge circuit 16 may be used to pre-charge the energy storage system 1 at start up, such as when starting up the energy storage system 1 in the vehicle 100. The pre-charge circuit 16 comprises at least one resistor R connected in series with the high voltage switch 12". During pre-charge, the high voltage switch 12′′′ is closed, i.e. it provides an electrical connection, while the high voltage switch 12′′ is open, i.e. disconnected. The high voltage switch 12′ is also closed. Thereby the system 1 is in a connected and powered state. The high voltage switch 12′′ may be closed after a predetermined time period, and/or when a certain condition has been fulfilled, indicative of that the energy storage system 1 is ready to be used for powering the load(s) 20 with sufficient power to drive the load(s) 20.

The energy storage system 1 further comprises a fuse 13 for disconnection of the one or more battery units 11 when the energy storage system 1 experiences an overcurrent being above a predetermined overcurrent value. The fuse 13 is here a pyrotechnic fuse, even though any other type may be used, as mentioned in the above. The fuse 13 is here provided between the battery cell(s) 11′ and the high voltage switches 12′′ and 12′′′. It shall be noted that the energy storage system 1 may in an alternative embodiment comprise more than one fuse, which are e.g. electrically connected in series and/or in parallel.

The energy storage system 1 is configured to:
during use, identify if a condition has occurred which requires immediate shutdown of the energy storage system 1; and if it is identified that immediate shutdown is required, the energy storage system 1 is further configured to:
measure a value indicative of current in the energy storage system 1;
if the measured value indicative of current is equal to or below a level at which it is safe to open the at least one high voltage switch 12′, 12′′, 12′′′, the energy storage system 1 is configured to immediately shut down the energy storage system 1 by opening the at least one high voltage switch 12′, 12′′, 12′′′, and
if the measured value indicative of current is above the level at which it is safe to open the at least one high voltage switch 12′, 12′′, 12′′′, but lower than the predetermined overcurrent value, the energy storage system 1 is configured to immediately shut down the energy storage system 1 by actively triggering the fuse 13.

In the shown example, current is measured by use of a current sensor 17 which is provided proximate the battery cell(s) 11′. Of course, current in the system 1 may be measured in any other way known to the skilled person.

Further, in the shown example, in order to shut down the energy storage system 1 by one or more of the high voltage switches 12′, 12′′, 12′′′, only the switch 12′ may be opened, and/or the switches 12′′ and 12′′′ may both be opened.

According to an embodiment, the fuse 13 may be actively triggered when the following condition is fulfilled:

$$I_{Fuse} > I_{actual} < I_{Break\ connector}$$

wherein $I_{Break\ connector}$ is a maximum level at which it is safe to open the at least one high voltage switch 12′, 12′′, 12′′′, $I_{Actual}$ is the current measured by e.g. the current sensor 17, and $I_{Fuse}$ is the predetermined overcurrent value. This range may in one embodiment be defined as a "limbo range" in which the fuse 13 will not be automatically triggered and where also the at least one high voltage switch 12′, 12′′, 12′′′ may be damaged, or not possible to open due to a too high current.

However, when the current $I_{Actual}$ is lower than $I_{Break\ connector}$, the at least one switch 12′, 12′′, 12′′′ can be used, implying no need to actively trigger the fuse 13. Thereby, the energy storage system 1 can still in such a situation be shut down without consuming the fuse 13.

Furthermore, at least one of the level at which it is safe to open the at least one high voltage switch 12′, 12′′, 12′′′ and the predetermined overcurrent value may be adjustable. Accordingly, the above-mentioned range may be adjustable, implying an increased flexibility. For example, the battery unit 11 may be reused in another system, such as moved from the truck 100 in FIG. 1 to another application. In the other application, other limit values for the above-mentioned range may be required, and by having adjustable levels, a more flexible energy storage system 1 is achieved.

The energy storage system 1 may further be configured to automatically adjust the at least one of the level at which it is safe to open the at least one high voltage switch 12′, 12′′, 12′′′ and the predetermined overcurrent value in dependence on a changed vehicle state, such as when changing from a charging state to a driving state, or vice versa.

The energy storage system may further be configured to identify if the at least one high voltage switch 12′, 12′′, 12′′′ is unable to be disconnected, and if the at least one high voltage switch 12′, 12′′, 12′′′ is unable to be disconnected, the energy storage system 1 may further be configured to actively trigger the fuse 13 when it also has been identified that immediate shutdown is required.

The condition which requires immediate shutdown may correspond to at least one of the following conditions: an accident of the vehicle 100, an emergency stop signal, such as a signal generated when pressing an emergency button, and a short circuit fault.

The energy storage system 1 may as shown further comprise a dedicated hardware device 14, wherein the dedicated hardware device 14 is configured to obtain the measured value indicative of current in the energy storage system 1, in this case a value from the current sensor 17, and further configured to open the at least one high voltage switch 12′, 12′′, 12′′′ or actively trigger the fuse 13 in dependence on the measured value indicative of current in the energy storage system 1. The communication channel between the current sensor 17 and the dedicated hardware 14 is here indicated by an arrow with a dashed line. The communication may be performed in any suitable manner, such as by a wired and/or wireless connection.

The energy storage system 1 may further comprise a second hardware device 15, preferably separate from the dedicated hardware device 14, which is configured to monitor if the condition has occurred which requires immediate shutdown of the energy storage system 1, and wherein the second hardware device 15 is further configured to issue a signal to the dedicated hardware device 14 when the condition has occurred. The signal communicated to the dedicated hardware device 14 is represented by the arrow with the dashed line provided therebetween. Further, the second hardware device may obtain signals indicative of that the condition has occurred which requires immediate shut down. This is indicated by another arrow with a dashed line in FIG. 2. Such signal may for example be a signal indicating that an airbag has been triggered, an accident has occurred or any other signal.

As mentioned in the above, the hardware devices 14, 15 are preferably electronic control units. The electronic control units 14, 15 may comprise hardware, and/or hardware and software. As such, the electronic control units may comprise a computer program as disclosed herein.

Figure 3:
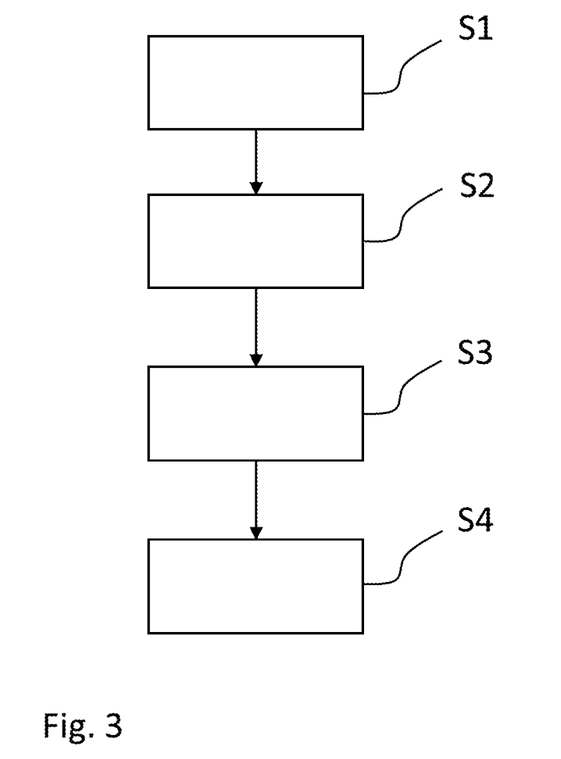
FIG. 3 is a flowchart of a method according to an example embodiment of the present invention.

With respect to FIG. 3, a flowchart of an embodiment of a method according to the second aspect of the invention is shown. The method may for example be used for the energy storage system 1 as shown in FIG. 2. The method comprises:

S1: during use of the energy storage system, identifying if a condition has occurred which requires immediate shutdown of the energy storage system 1;

S2: measuring a value indicative of current in the energy storage system 1 when it is identified that immediate shutdown is required;

S3: immediately shutting down the energy storage system 1 by opening the at least one high voltage switch 12', 12", 12''' if the measured value indicative of current is equal to or below a level at which it is safe to open the at least one high voltage switch 12', 12", 12'''; and S4: immediately shutting down the energy storage system 1 by actively triggering the fuse 13 if the measured value indicative of current is above the level at which it is safe to open the at least one high voltage switch 12 but lower than the predetermined overcurrent value.

The method may comprise further steps as e.g. mentioned in the above. Further, the steps S1-S4 may not necessarily be performed in the above mentioned order, but may be performed in any other order recognized by the skilled person.

It is to be understood that the present invention is not limited to the embodiments described above and illustrated in the drawings; rather, the skilled person will recognize that many changes and modifications may be made within the scope of the appended claims.

The invention claimed is:

1. An energy storage system, comprising:
   one or more battery units for storing electrical energy;
   at least one high voltage switch for connection and disconnection of the one or more battery units to at least one load, such as an electrical machine;
   a fuse for disconnection of the one or more battery units when the energy storage system experiences an overcurrent being above a predetermined overcurrent value;
   wherein the energy storage system is configured to
      during use, identify if a condition has occurred which requires immediate shutdown of the energy storage system; and if it is identified that immediate shutdown is required, the energy storage system is further configured to:
   measure a value indicative of current in the energy storage system;
   if the measured value indicative of current is equal to or below a level at which it is safe to open the at least one high voltage switch, the energy storage system is configured to immediately shut down the energy storage system by opening the at least one high voltage switch, and
   if the measured value indicative of current is above the level at which it is safe to open the at least one high voltage switch but lower than the predetermined overcurrent value, the energy storage system is configured to immediately shut down the energy storage system by actively triggering the fuse.

2. The energy storage system according to claim 1, wherein at least one of the level at which it is safe to open the at least one high voltage switch and the predetermined overcurrent value is adjustable.

3. The energy storage system according to claim 2, wherein the energy storage system is further configured to automatically adjust the at least one of the level at which it is safe to open the high voltage switch and the predetermined overcurrent value in dependence on a changed vehicle state, such as when changing from a charging state to a driving state, or vice versa.

4. The energy storage system according to claim 1, wherein the energy storage system is further configured to identify if the at least one high voltage switch is unable to be disconnected, and if the at least one high voltage switch is unable to be disconnected, the energy storage system is further configured to actively trigger the fuse when it also has been identified that immediate shutdown is required.

5. The energy storage system according to claim 1, wherein the condition which requires immediate shutdown corresponds to at least one of the following conditions: an accident, an emergency stop signal, a short circuit fault.

6. The energy storage system according to claim 1, wherein the fuse is a pyrotechnic fuse.

7. The energy storage system according to claim 1, further comprising a dedicated hardware device, wherein the dedicated hardware device is configured to obtain the measured value indicative of current in the energy storage system and to open the at least one high voltage switch or actively trigger the fuse in dependence on the measured value indicative of current in the energy storage system.

8. The energy storage system according to claim 7, further comprising a second hardware device, preferably separate from the dedicated hardware device, which is configured to monitor if the condition has occurred which requires immediate shutdown of the energy storage system, and wherein the second hardware device is further configured to issue a signal to the dedicated hardware device when the condition has occurred.

9. A method for controlling an energy storage system of a vehicle, wherein the energy storage system comprises:
   one or more battery units for storing electrical energy;
   at least one high voltage switch for connection and disconnection of the one or more battery units to at least one load, such as an electrical machine;
   a fuse for disconnection of the one or more battery units when the energy storage system experiences an overcurrent being above a predetermined overcurrent value;
   wherein the method comprises:
   during use of the energy storage system, identifying if a condition has occurred which requires immediate shutdown of the energy storage system;
   measuring a value indicative of current in the energy storage system when it is identified that immediate shutdown is required;
   immediately shutting down the energy storage system by opening the at least one high voltage switch if the measured value indicative of current is equal to or below a level at which it is safe to open the at least one high voltage switch; and
   immediately shutting down the energy storage system by actively triggering the fuse if the measured value indicative of current is above the level at which it is safe to open the at least one high voltage switch but lower than the predetermined overcurrent value.

10. The method according to claim 9, further comprising automatically adjusting the at least one of the level at which it is safe to open the high voltage switch and the predetermined overcurrent value in dependence on a changed vehicle state, such as when changing from a charging state to a driving state, or vice versa.

11. The method according to claim 9, further comprising identifying if the at least one high voltage switch is unable to be disconnected, and if the at least one high voltage switch is unable to be disconnected, the method further comprises actively triggering the fuse when it also has been identified that immediate shutdown is required.

12. At least one control unit for controlling an energy storage system of a vehicle, wherein the at least one control unit is configured to perform the method according to claim 9.

13. A non-transitory computer readable medium having stored thereon a computer program to perform the method of claim 9 when run on a computer.

14. A vehicle comprising the energy storage system according to claim 1.

* * * * *